(12) United States Patent
Fong et al.

(10) Patent No.: US 8,026,512 B2
(45) Date of Patent: Sep. 27, 2011

(54) MOBILITY ENGINEERED ELECTROLUMINESCENT DEVICES

(75) Inventors: Hon Hang Fong, Ithaca, NY (US);
Kiyotaka Mori, Cambridge (GB);
George M. Malliaras, Ithaca, NY (US);
Yu Jye Foo, Singapore (SG)

(73) Assignees: Panasonic Corporation, Osaka (JP);
Cornell Research Foundation, Inc., Ithaca, NY (US)

( * ) Notice: Subject to any disclaimer, the term of this patent is extended or adjusted under 35 U.S.C. 154(b) by 216 days.

(21) Appl. No.: 11/600,370

(22) Filed: Nov. 16, 2006

(65) Prior Publication Data
US 2008/0116450 A1    May 22, 2008

(51) Int. Cl.
*H01L 35/24* (2006.01)
(52) U.S. Cl. ........................................................ 257/40
(58) Field of Classification Search .................. 257/40
See application file for complete search history.

(56) References Cited

U.S. PATENT DOCUMENTS

| | | | | |
|---|---|---|---|---|
| 6,759,145 | B2* | 7/2004 | Lin et al. | 428/690 |
| 7,061,011 | B2* | 6/2006 | Forrest et al. | 257/40 |
| 7,355,199 | B2* | 4/2008 | Meng | 257/40 |
| 2004/0069995 | A1* | 4/2004 | Magno et al. | 257/80 |
| 2006/0068223 | A1* | 3/2006 | Nariyuki et al. | 428/690 |
| 2006/0131562 | A1* | 6/2006 | Li | 257/40 |
| 2006/0214570 | A1* | 9/2006 | Malliaras et al. | 313/506 |

OTHER PUBLICATIONS

Vi-En Choong (Arizona), Song Shi (Arizona), Jay Curless (Arizona) and Franky So (Florida); *Bipolar Transport Organic Light Emitting Diodes With Enhanced Reliability by LiF Doping*; Applied Physics Letters; vol. 76, No. 8; Feb. 21, 2000.

Anna B. Chwang (Ewing N.J.), Raymond C. Kwong (Ewing N.J.) and Julie J. Brown (Ewing N.J.); *Graded Mixed-Layer Organic Lighto-Emitting Devices*; Applied Physics Letters; vol. 80, No. 5; Feb. 4, 2002.

Yusunori Kijima, Nobutoshi (Japan), A Sai (Japan) and Shin-Ichiro Tamura (Japan); *A Blue Organic Light Emitting Diode*; JPN. J. Applied Physics; vol. 39 (1999) pp. 5274-5277; Part 1, No. 9A, Sep. 9, 1999.

Hany Aziz, Zoran D. Popovic, Nan-Xing Hu, Ah-Mee Hor, Gu Xu; *Degradation Mechanism of Small Molecule-Based Organic-Light Emitting Devices*; Science (www.Sciencemag.Org) vol. 283 Mar. 19, 1999.

S. W. Liu (Taiwan), C.A. Huang, J. H. Lee (Taiwan), K. H. Yang (Taiwan), C.C. Chen (Taiwan), Y. Chang (Taiwan); *Blue Mixed Host Organic Light Emitting Devices*; Science Direct (www.Sciencedirect.Com); Thin Solid Films 453-454 (2004); 312-315; (www.Elsevier.Com/Locate/TSF.

(Continued)

*Primary Examiner* — Steven Loke
*Assistant Examiner* — Brandon Fox
(74) *Attorney, Agent, or Firm* — RatnerPrestia

(57) ABSTRACT

An electroluminescent (EL) device, including a semiconductor structure, a first electrode, and a second electrode. The semiconductor structure includes: a first higher mobility semiconductor layer having a first mobility; a second higher mobility semiconductor layer having a second mobility; and a lower mobility semiconductor layer formed between the first higher mobility semiconductor layer and the higher mobility second semiconductor layer. The lower mobility semiconductor layer has a third mobility that is less than the first mobility and the second mobility. The semiconductor structure includes EL semiconducting material in the first higher mobility semiconductor layer, the second higher mobility semiconductor layer, and/or the lower mobility semiconductor layer. The first electrode is coupled to the first higher mobility semiconductor layer of the semiconductor structure. The second electrode is coupled to the second higher mobility semiconductor layer of the semiconductor structure.

14 Claims, 6 Drawing Sheets

OTHER PUBLICATIONS

J. A. Hagen; W. Li and A. J. Steckl (Univ. of Cincinnati);and J.G. Grote (U.S. Air Force Research Lab. Dayton, Ohio); *Enhanced Emission Efficiency in Organic Light-Emitting Diodes Using Deoxyribonucleic Acid Complex As an Electron Blocking Layer*; Applied Physics Letters 88, 171109 (2006).

Zoran D. Popovic, Hany Aziz and Nan-Xing Hu (Ontario, Canada); Andronique Loannidis (Webster, New York); Paulo N. M. dos Anjos (Ontario, Canada): Simultaneous *Electroluminescence and Photoluminescence Aging Studies of Tris (8-Hydroxyquinoline) Aluminum-Based Organic Light-Emitting Devices*; Journal of Applied Physics; vol. 89, No. 8; Apr. 15, 2001.

P.M. Borsenberger, E.H. Magin, J. Shi (Rochester, New York); *Charge Transport in Vapor Deposited Molecular Glasses*; 1996 Elsevier Science B.V.; Physica B 217 (1996) 212-220.

\* cited by examiner

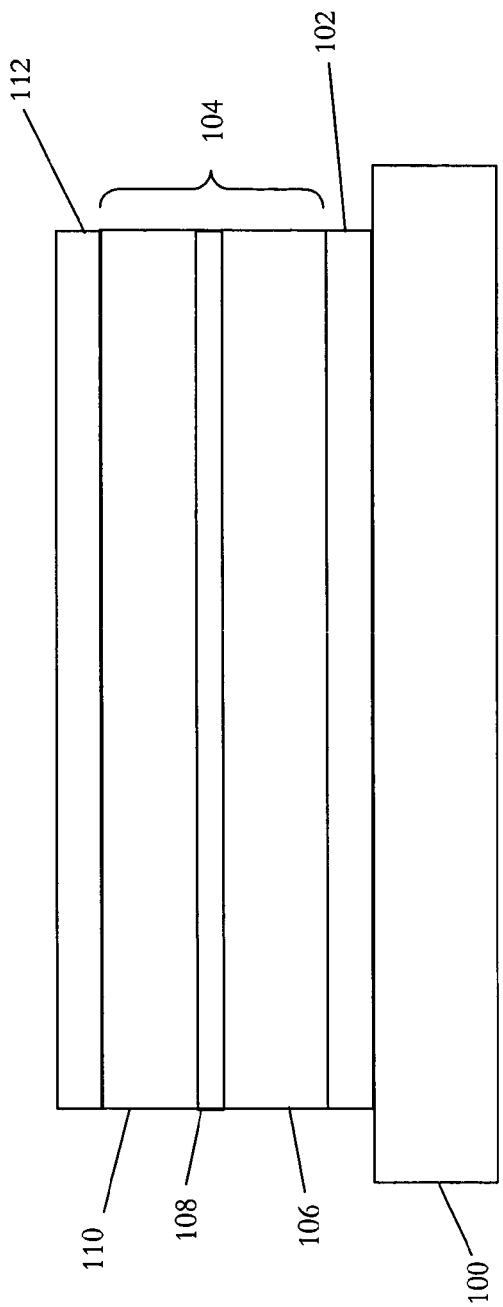
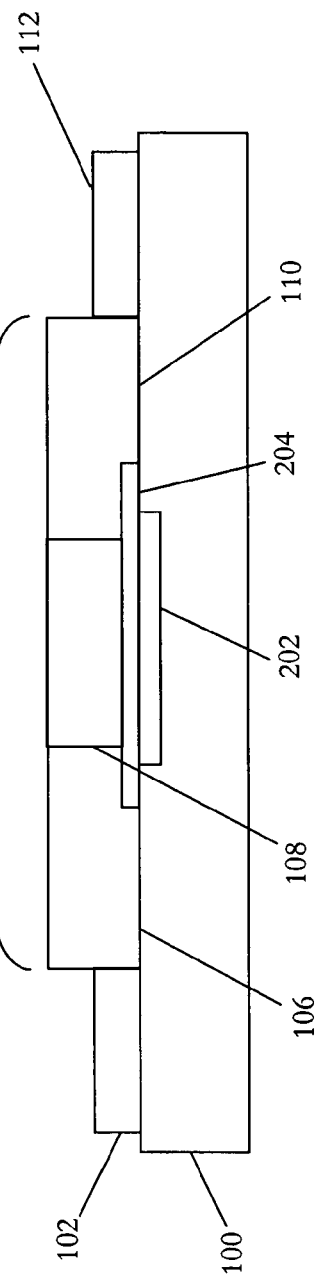

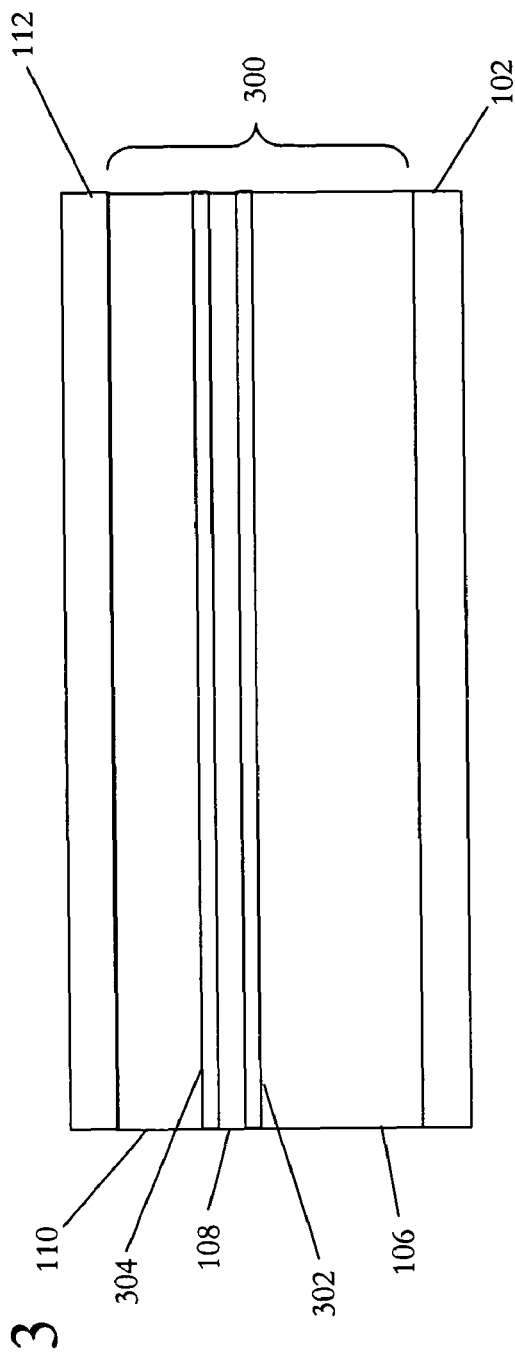
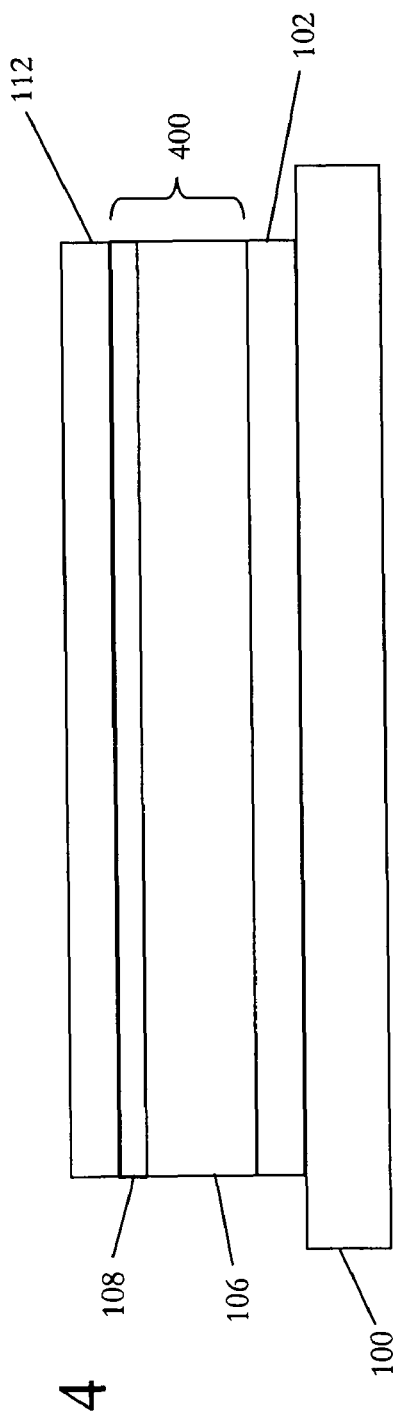

MOBILITY ENGINEERED ELECTROLUMINESCENT DEVICES

GOVERNMENT FUNDING

This invention was made with government support under Contract No. 0094047 awarded by the National Science Foundation. The government has certain rights in the invention.

FIELD OF THE INVENTION

The present invention concerns electroluminescent (EL) semiconductor devices that include mobility-engineered structures within the semiconductor material. These mobility engineered structures may allow improved capabilities for a variety of EL semiconductor devices. In particular, the optical output of organic EL devices may be increased.

BACKGROUND OF THE INVENTION

Organic light-emitting diodes (OLED's) are an exciting technology that may find uses a number of products. However, these devices still have a number of hurdles to overcome to attain widespread use.

Extensive effort has been focused on the development of high efficiency devices. The introduction of heterojunctions has been shown to greatly improve the luminous efficiency of OLED's by C. W. Tang and S. A. VanSlyke (Appl. Phys. Lett. 51, 913 (1987)). Heterojunction OLED's are often composed by multilayers of amorphous organic thin films, sandwiched between two electrodes. Conventionally, the device structure has consisted of a hole injecting layer (HIL), a hole transporting layer (HTL), a light emitting layer (EML), an electron transporting layer (ETL), and an electron injecting layer, as well as an ITO, or other substantially transparent conductor, anode and a cathode (i.e. an ITO/HIL/HTL/EML/ETL/EIL/cathode structure). Usually, the HTL possesses a highest occupied molecular orbital (HOMO) and a lowest unoccupied molecular orbital (LUMO) that are high compared to those of the ETL. Consequently, holes may be injected from the anode into the HOMO of the HTL, while electrons may be injected from the cathode into the LUMO of the ETL. In this heterogeneous OLED structure, built-in barriers are established for injected carriers due to the difference between the $HOMO_{ETL}$ and the $HOMO_{HTL}$ and the difference between the $LUMO_{HTL}$ and the $LUMO_{ETL}$ for holes and electrons, respectively.

Because the EML is sandwiched between the HTL and the ETL, these built-in barriers can confine electrons and holes in the EML. To increase the luminous efficiency, the EML may be doped with highly fluorescent organic dye as described by C. W. Tang, S. A. VanSlyke, and C. H. Chen in ELECTROLUMINESCENCE OF DOPED ORGANIC THIN FILMS (J. Appl. Phys. 65, 3610 (1989)).

Inserting an extra layer such as a hole/electron blocking layer may also enhance the effective built-in barrier of this OLED structure to confine, in the EML, holes/electrons for recombination as described by Y. Kijima, N. Asai, and S. Tamura in A BLUE ORGANIC LIGHT EMITTING DIODE (Jpn. J. Appl. Phys. 38, 5274 (1999)) and J. A. Hagen, W. Li, A. J. Steckl, and J. G. Grote in ENHANCED EMISSION EFFICIENCY IN ORGANIC LIGHT-EMITTING DIODES USING DEOXYRIBONUCLEIC ACID COMPLEX AS AN ELECTRON BLOCKING LAYER (Appl. Phys. Lett. 88, 171109 (2006)). However, heterojunction interfaces are known to incur device instability due to existence of high local electric fields established along the heterojunction interface. This potential issue is discussed in articles by V.-E. Choong, S. Shi, J. Curless, C.-L. Shieh, H.-C. Lee, J. Shen, and J. Yang in ORGANIC LIGHT EMITTING DIODES WITH A BIPOLAR TRANSPORT LAYER (Appl. Phys. Lett. 75, 172 (1999)) and V.-E. Choong, S. Shi, J. Curless, and F. So in BIPOLAR TRANSPORT ORGANIC LIGHT EMITTING DIODES WITH ENHANCED RELIABILITY BY LiF DOPING (Appl. Phys. Lett. 76, 958 (2000)). Excess carriers accumulating near the boundaries of the EML may thus lead to intrinsic degradation of organic materials as described by H. Aziz, Z. D. Popovic, N. X. Hu, A. M. Hor, and G. Xu in DEGRADATION MECHANISM OF SMALL MOLECULE-BASED ORGANIC LIGHT-EMITTING DEVICES (Science 283, 1900 (1999)) and Z. D. Popovic, H. Aziz, N. X. Hu, A. Ioannidis, and P. N. M. dos Anjos in SIMULTANEOUS ELECTROLUMINESCENCE AND PHOTOLUMINESCENCE AGING STUDIES OF TRIS(8-HYDROXYQUINOLINE) ALUMINUM-BASED ORGANIC LIGHT-EMITTING DEVICES (J. Appl. Phys. 89, 4673 (2001)).

One approach to eliminate this excess charge accumulation incorporates charge transporting materials into the EML to form an EML-HTL-ETL co-host emitter (CHE) instead of a single EML. As a result, the proposed OLED device structure becomes: ITO/HIL/HTL/EML:HTL:ETL/ETL/EIL/cathode. This structure has been described by a number of authors including: H. Aziz, et al. (Science 283, 1900 (1999)); Z. D. Popovic, et al. (J. Appl. Phys. 89, 4673 (2001); A. B. Chwang, R. C. Kwong, and J. Brown in GRADED MIXED-LAYER ORGANIC LIGHT-EMITTING DEVICES (Appl. Phys. Lett. 80, 725 (2002); T.-H. Liu, C.-Y. Iou, and C. H. Chen in DOPED RED ORGANIC ELECTROLUMINESCENT DEVICES BASED ON A COHOST EMITTER SYSTEM (Appl. Phys. Lett. 83, 5241 (2003)); S. W. Liu, C. A. Huang, J. H. Lee, K. H. Yang, C. C. Chen, and Y. Chang in BLUE MIXED HOST ORGANIC LIGHT EMITTING DEVICES (Thin Solid Films 453, 312 (2004)); and H. Kanno, Y. Hamada, and H. Takahashi in DEVELOPMENT OF OLED WITH HIGH STABILITY AND LUMINANCE EFFICIENCY BY CO-DOPING METHODS FOR FULL COLOR DISPLAYS (IEEE J. Select. Topics Quantum. Elect. 10, 30 (2004)). In this CHE system, a more complicated doping scheme (two hosts with one dopant) and a more complicated fabrication process, as compared to an EML only device, are typically used for color tuning.

This layer structure, however, leads to a more complicated doping scheme (two hosts with one dopant), a more complicated fabrication process, and as well as potentially low device stability. Thus, there has been demand for an exemplary OLED device structure that may be manufactured using a simplified process. The present invention is targeted to meet this demand with a novel, yet simple, EL device structure that may be used with OLED's and other EL semiconductor devices including inorganic EL devices.

SUMMARY OF THE INVENTION

An exemplary embodiment of the present invention is an electroluminescent (EL) device, including a semiconductor structure, a first electrode, and a second electrode. The semiconductor structure includes: a first higher mobility semiconductor layer having a first mobility; a second higher mobility semiconductor layer having a second mobility; and a lower mobility semiconductor layer formed between the first semiconductor layer and the second semiconductor layer. The lower mobility semiconductor layer has a third mobility that is less than the first mobility and the second mobility. The semiconductor structure includes EL semiconducting material in the first higher mobility semiconductor layer, the second higher mobility semiconductor layer, and/or the lower mobility semiconductor layer. The first electrode is coupled to the first higher mobility semiconductor layer of the semiconductor structure. The second electrode is coupled to the second higher mobility semiconductor layer of the semiconductor structure.

Another exemplary embodiment of the present invention is an electroluminescent (EL) device, including a semiconductor structure, a first electrode, and a second electrode. The semiconductor structure includes a higher mobility semiconductor layer having a first mobility and a lower mobility semiconductor layer formed on the higher mobility semiconductor layer. The lower mobility semiconductor layer has a second mobility that is less than the first mobility. The semiconductor structure includes EL semiconducting material in the higher mobility semiconductor layer and/or the lower mobility semiconductor layer. The first electrode is coupled to the higher mobility semiconductor layer of the semiconductor structure. The second electrode is coupled to the lower mobility semiconductor layer of the semiconductor structure.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawing are the following figures:

FIG. 1 is a side plan drawing illustrating an exemplary EL semiconductor device with a mobility engineered semiconductor structure according to the present invention.

FIG. 2 is a side plan drawing illustrating an alternative exemplary EL semiconductor device with a mobility engineered semiconductor structure according to the present invention.

FIG. 3 is a side plan drawing illustrating another alternative exemplary EL semiconductor device with a mobility engineered semiconductor structure according to the present invention.

FIG. 4 is a side plan drawing illustrating a further alternative exemplary EL semiconductor device with a mobility engineered semiconductor structure according to the present invention.

DETAILED DESCRIPTION OF THE INVENTION

Figure 5:
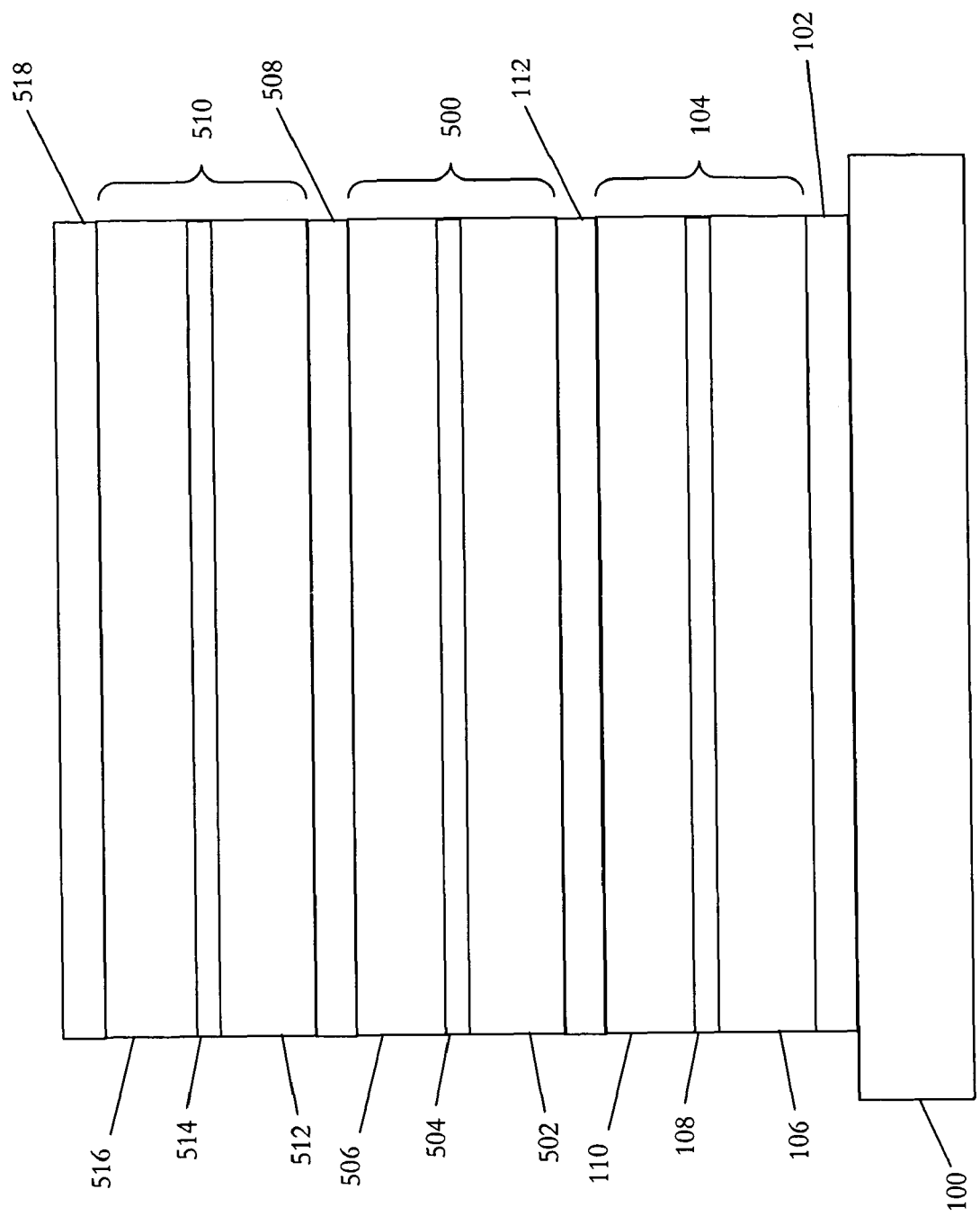
FIG. 5 is a side plan drawing illustrating an exemplary multilayer EL semiconductor device with mobility engineered semiconductor structures according to the present invention.

Exemplary embodiments of the present invention include an alternative approach to improving the performance of electroluminescent devices, including organic light-emitting diodes (OLED's), by mobility engineering. This approach allows charges to be confined for efficient recombination without forming heterojunctions or doping the organic semiconductor material with dyes. It is noted that, although many exemplary embodiments of the present invention are described herein in terms of OLED's, other EL semiconductor devices may benefit from the use of exemplary mobility engineered semiconductor structures according to the present invention. Such exemplary EL semiconductor devices may include organic and/or inorganic semiconductor lasers, and integrated circuits that include EL elements.

Light emitting diodes are formed of semiconductor sandwiched between first and second electrodes. Electrons are injected from one electrode, typically called the cathode, and holes from are injected from the other electrode, typically called the anode, upon application of forward bias voltage in between electrodes. The carriers injected into the semiconductor travel through the semiconductor, where they may recombine with an opposite polarity carrier and emit light. In typical device, to improve the efficiency of the recombination process a junction is formed from semiconductors of one conduction type and the other type (i.e. n-type and p-type). At this junction, the energy barrier may significantly impede the flow electrons and holes. The resulting increased carrier population increases recombination of the carrier and may improve device efficiency.

In exemplary embodiments of the present invention, semiconductor structures including a low mobility portion in a single semiconductor body are utilized to significantly slow carrier flow resulting in an increased carrier population and radiative recombination. Organic semiconductors used in exemplary embodiments may desirably have bipolar or ambipolar characteristics.

A bipolar organic host material may be used to replace the hole and electron dominant charge transporting layers adopted in heterojunction OLED's. This host layer may be formed of a single bipolar organic material or a co-host bipolar organic composite. The emitting zone of this exemplary OLED device may be formed by doping or de-doping a portion of the host layer to lower the host mobility (i.e. conductivity). In the case of co-host composite material, the two organic semiconductor molecules desirably have compatible highest occupied molecular orbital (HOMO) and lowest unoccupied molecular orbital (LUMO) levels to reduce charge trapping. It is noted that the concept of mobility engineering a bipolar organic host system is applicable not only to confine carriers for enhanced recombination, but also to tailor the electron-to-hole mobility ratio of the host. It is contemplated that this homogeneous OLED structure may reduce the intrinsic degradation of organic layers because excess carriers may be dispersed through the bipolar organic host rather than concentrated at a heterojunction.

Additionally, OLED's formed with bipolar organic semiconducting layers may facilitate AC operation when combined with proper electrodes. AC operation may be desirable to enhance the device lifetime and carrier injection. During the device operation, the lifetime of an OLED may be affected by the degradation of the light-emitting materials (i.e. the organic semiconductor structure) and also by a degradation of charge injection into these light-emitting materials.

For example, high current operation of OLED devices doped with phosphorescent materials may be prohibited because of triplet-triplet annihilation in the doped material. However, if the device is operated in AC mode, it may be possible to drive the device at a higher current.

Also, for EL devices doped with fluorescent or phosphorescent materials, the device efficiency may suffer due to a loss of charge injection from the anode and/or cathode because of formation of fixed charge in the device near one or both of the electrodes during DC operation. This fixed charge screens out the electric field, thereby lowering the charge injection. Thus, if a device is continuously operated in the DC mode, the driving voltage necessary to maintain desired operation may increase gradually over time.

Operation in AC mode, however, may reduce this problem. This is because using an AC or pulsed mode, carrier accumulation near the anode or cathode interfaces may be controlled or even eliminated. This results in improved carrier injection into the device. For example, if excess electrons injected from the cathode are accumulated near the anode interface, the hole injection may be improved by reversing the electric field to sweep the electrons back out of the organic semiconductor. Similarly, if excess holes injected from the anode are accumulated near the cathode interface, the electron injection can be improved by reversing the electric field. It is noted that the waveform of the AC source is not limited to square, or sinusoidal wave, but it may be selected to substantially optimize device performance based on the device geometry and the semiconductor material used in the device.

AC or pulsed mode operation may also be used to tune the emission color or efficiency of an exemplary EL device according to the present invention. For example, if the emitting materials of the EL include more than one type of EL semiconductor material (which may emit at different wavelengths), these materials usually have different fluorescence lifetimes. Using AC or pulsed mode operation, it may be possible to selectively change the ratio of emissions from the different EL semiconductor materials.

AC or pulsed operation may also be used in an exemplary thin film transistor (TFT) geometry according to the present invention. For example, if the source-to-drain current is a modulated DC source (i.e. a DC component plus an AC, or pulsed component), the interface may response to the AC components, allowing extra-control of the characteristics of the TFT due to the different responses of charge injection/transport in AC mode.

FIG. 1 illustrates an exemplary EL semiconductor device of the present invention. This exemplary EL semiconductor device includes: substrate 100; semiconductor structure 104; and electrodes 102 and 112. It is noted that, as shown in the exemplary embodiment of FIG. 3, it is not necessary for the exemplary embodiments of the present invention to be formed on a substrate. The semiconductor structure itself may provide sufficient structural support for the device. Such a design may be particularly desirable to produce extremely lightweight and/or flexible organic EL devices.

Substrate 100 may be formed of any substrate material typically used in organic or inorganic semiconductor fabrication, including glass, plastic, metal, semiconductor, or ceramic substrate materials. Electrodes 102 and 112 may be formed of any electrode materials known in the art as long as the work function of the electrode material is compatible with the material of semiconductor structure 104 and the electrode material is not chemically reactive with the material of semiconductor structure 104. Multi-layer electrode structures may also be used. Electrodes 102 and 112 may desirably be formed of the same electrode materials, particularly if AC operation is desired. However, the electrode materials may be selected to preferentially inject holes from one electrode and electrons from the other, if primarily DC operation is desired.

Electrode 102 is shown in FIG. 1 as an element separate from substrate 100 and located between substrate 100 and semiconductor structure 104, however, one skilled in the art will understand that this is for illustrative purposes only and is not intended to be limiting. For example, electrode 102 may be formed from substrate 100, if substrate 100 is a substantially conductive material, or a portion of substrate 100 by doping that portion of substrate 100, if substrate 100 is a substantially non-conductive material. Additionally, one skilled in the art will understand that electrode 102 need not separate substrate 100 from semiconductor structure 104 as long as electrode 102 is coupled to first higher mobility semiconductor layer 106 of semiconductor structure 104. For example, electrode 102 may be coupled to the side of first higher mobility semiconductor layer 106.

At least one of the layers of semiconductor structure 104 desirably includes an EL semiconducting material. It may also be desirable for electrode 112 to be formed of a substantially light-transmissive conductor, such as ITO. In this case, electrode 102 may be formed of a highly reflective material such as gold, silver, aluminum, etc. Alternatively, substrate 100 and/or electrode 102 may be formed of substantially light-transmissive materials and electrode 112 may be formed of a highly reflective material. If both electrodes 102 and 112 are formed of substantially reflective materials, the exemplary EL semiconductor device formed may be a resonant cavity LED or OLED or a semiconductor based vertical cavity laser.

Mobility engineered semiconductor structure 104 includes first higher mobility semiconductor layer 106, lower mobility semiconductor layer 108, and second higher mobility semiconductor layer 110. All three of these layers are formed of semiconducting material. Inorganic semiconducting materials or small molecule, oligomer, and/or polymer organic semiconducting materials may be used. In many exemplary embodiments of the present invention, it may be desirable for all three layers of semiconductor structure 104 to be formed of the same semiconducting material. Various methods of doping or damaging the semiconducting material may be used to reduce the mobility of the portion of the semiconducting material that forms lower mobility semiconductor layer 108. In the case of an organic semiconducting material, a bulky group may be added in this layer to lower the mobility. Exemplary methods of doping or damaging organic semiconducting material form lower mobility organic semiconductor layer 108 are described in detail below with reference to the exemplary methods of FIGS. 6 and 7. However, one skilled in the art will understand that the various layers of semiconductor structure 104 may be formed of different semiconducting materials to achieve the desired mobilities as well.

As described below with reference to FIG. 6, an organic semiconductor structure may be formed in one or more thin film organic semiconductor layer(s). The thin film organic semiconductor layer(s) may be deposited on substrate 100 and/or electrode 102 using a vacuum deposition technique, such as CVD, LACVD, or MOCVD. Typically, these thin film organic semiconductor layers may include small molecule organic semiconducting material, although oligomer or polymer semiconductor materials may be formed as well.

In other exemplary embodiments of the present invention, described below with reference to FIG. 7, an organic semiconductor structure may include two or more organic semiconductor layers formed to the surface of substrate 100 and/or electrode 102 using spin-coating, printing or other techniques of forming organic semiconductor layers.

Alternatively, a self-assembling, block copolymer material may be used to form an organic semiconductor structure. This self-assembling, block copolymer material may be designed such that each polymer strand includes three sections corresponding to the three layers of semiconductor structure 104 shown in FIG. 1. This exemplary method of forming an organic semiconductor structure is described in detail below with reference to the exemplary method of FIGS. 8.

Numerous methods of forming inorganic semiconductor structures are known in the art.

The semiconductor material of first higher mobility semiconductor layer 106 has a first mobility, and the semiconductor material of second higher mobility semiconductor layer 110 has a second mobility. Both of these mobilities are desirably high enough to allow significant conduction of carriers through semiconductor structure 104 and these mobilities are necessarily higher than the mobility of lower mobility semiconductor layer 108. In a number of exemplary embodiments it may be desirable for first higher mobility semiconductor layer 106 and second higher mobility semiconductor layer 110 to be formed of the same semiconductor material and, thus, to have the same mobility. However, in other exemplary embodiments, such as the exemplary embodiment of FIG. 3, in may be desirable for these layers to have different mobilities.

The ratio of the mobilities of higher mobility semiconductor layers 106 and 110 to the mobility of lower mobility semiconductor layer 108 is desirably at least 2, however, this ratio may be 10, 100, 1000, 10,000, or even higher, depending on the thickness of the various layers and the desired lifetime for carriers within lower mobility semiconductor layer 108.

As described above, it may be desirable for first higher mobility semiconductor layer 106 and second higher mobility semiconductor layer 110 of semiconductor structure 104 to include a bipolar organic semiconductor material. These layers may be formed of a mono-species bipolar organic semiconductor material or a mixed species bipolar organic semiconductor material. Additionally, the bipolar organic semiconductor material may be polarizable. Using bipolar organic semiconductor materials to form semiconductor structure 104, may allow AC operation of the device. The use of bipolar organic semiconductor materials, particularly polarizable bipolar organic semiconductor materials, may allow the formation of fault tolerant EL semiconductor devices, similar to those disclosed in co-pending U.S. patent application Ser. No. 11/091,088, which is incorporated herein by reference, with mobility engineered organic semiconductor structures.

Alternatively, one or both of higher mobility semiconductor layers 106 and 110 may include a p-type organic semiconductor material or an n-type organic semiconductor material. In this case, lower mobility semiconductor layer 108 may also have a low enough mobility to function similarly to an intrinsic semiconductor layer, so that semiconductor structure 104 may operate similarly to a P-I-N, P-I-P, or N-I-N junction.

Although exemplary semiconductor structures according to the present invention may vary in thickness over a wide range, test OLED devices with organic semiconductor structures approximately 90 nm thick and approximately 150 nm thick have been manufactured by the inventors. The lower mobility organic semiconductor layers in these test OLED devices were approximately 30 nm thick. One skilled in the art will understand, however, that these dimensions are only exemplary and that the thicknesses of both the higher mobility organic semiconductor layers and the lower mobility organic semiconductor layer may be varied to control the conductivity and carrier lifetime of the organic semiconductor structures of exemplary organic semiconductor structures according to the present invention.

Further, in the exemplary embodiment of FIG. 1, the thickness of first higher mobility semiconductor layer 106 is shown to be approximately equal to the thickness of second higher mobility semiconductor layer 110. This symmetry may be desirable for AC operation of an exemplary EL semiconductor device. However, as illustrated by semiconductor structure 300 of FIG. 3, this is not a necessary feature of the present invention. In many exemplary embodiments of the present invention, this asymmetry may be desirable to help achieve the desire ratio of electrons and holes within the lower mobility semiconductor layer due to differences in the hole and electron mobilities of the layers of semiconductor structure 300, and/or the doping of these layers.

The exemplary embodiment of FIG. 3 also includes electron (or hole) blocking layers 302 and 304 in semiconductor structure 300. These blocking layers are formed between first, or second, higher mobility semiconductor layer 106, or 110, and lower mobility semiconductor layer 108. The formation of such blocking layers is known in the art. In the exemplary embodiment of FIG. 3, these blocking layers may serve to improve confinement of carriers within lower mobility semiconductor layer 108, particularly during DC operation. For example, if the exemplary EL semiconductor device of FIG. 3 is operated with current flowing from electrode 112 to electrode 102, blocking layer 302 may desirably be a hole blocking layer to improve confinement of holes injected into semiconductor structure 300 from electrode 112 within lower mobility semiconductor layer 108 and blocking layer 304 may desirably be an electron blocking layer to improve confinement of electrons injected into semiconductor structure 300 from electrode 102 within lower mobility semiconductor layer 108. Improving carrier confinement within lower mobility semiconductor layer 108 may desirably improve charge recombination. It is noted that if improved confinement of only one carrier type within lower mobility semiconductor layer 108 is desired then it may be desirable to include only one blocking layer in exemplary semiconductor structure 300. Formation of the suitable electron and/or hole blocking layers may depend on the materials from which semiconductor structure 300 is formed. However, one of ordinary skill in the art will understand how to form a suitable electron blocking layer or hole blocking layer.

As described above, the exemplary embodiment of FIG. 3 does not include a substrate. However one skilled in the art will understand that a substrate may be added to this exemplary embodiment to provide additional structural support if desired.

FIG. 2 illustrates another exemplary embodiment of the present invention. In this exemplary embodiment, semiconductor structure 200 is arranged in a lateral configuration with first higher mobility semiconductor layer 106, lower mobility semiconductor layer 108, and second higher mobility semiconductor layer 110 formed side-by-side on the surface of substrate 100. Electrodes 102 and 112 are formed at opposite sides of semiconductor structure 200 so that substantially all of the top surface of semiconductor structure 200, and the entire top surface of lower mobility semiconductor layer 108, are exposed. This exemplary configuration may be particularly desirable for EL semiconductor devices. Exposing the entire top surface of lower mobility semiconductor layer 108 eliminates the need for one or both of electrodes 102 and 112 to transmit light generated by the exemplary EL semiconductor device arranged in the lateral configuration of FIG. 2.

The exemplary organic semiconductor device of FIG. 2 further includes gate electrode 202 and gate insulator 204. Gate electrode 202 is electrically coupled to the organic semiconductor structure 200 through gate insulator 204. Thus, the exemplary semiconductor device of FIG. 2 may operate as a thin film transistor (TFT). It is noted that gate electrode 202 is illustrated in FIG. 2 as being formed in substrate 100 by doping a portion of substrate 100 followed by depositing an insulating layer to form gate insulator 204 over at least the portion of substrate 100 doped to form gate electrode 202. However, one skilled in the art will understand that gate electrode 202 may also be formed by depositing conductive material on the surface of substrate 100 followed by forming gate insulator 204 over gate electrode 202. Alternatively, the gate may be formed by depositing an insulating layer on at least the lower mobility semiconductor layer 108 of the semiconductor structure 200 to form gate insulator 204 and then depositing conductive material on gate insulator 204 to form gate electrode 202.

Gate electrode 202 may be used to control the intensity of light emitted by an exemplary EL semiconductor device, or may act as an electronic switch for the exemplary EL semiconductor device. Alternatively, gate electrode 202 may be used to control the wavelength of light emitted by an exemplary EL semiconductor device FIG. 5 illustrates another exemplary EL semiconductor device according to the present invention. This exemplary embodiment includes three semiconductor structures 104, 500, and 510 stacked on top of each other. Semiconductor structures 104 and 500 are separated by electrode 112 and semiconductor structures 500 and 510 are separated by electrode 508. Semiconductor structure 500 includes third higher mobility semiconductor layer 502, second lower mobility semiconductor layer 504, and fourth higher mobility semiconductor layer 506. Semiconductor structure 510 includes fifth higher mobility semiconductor layer 512, third lower mobility semiconductor layer 514, and sixth higher mobility semiconductor layer 516.

Stacking multiple organic semiconductor structures in this manner may be useful to multiply the effects of the exemplary EL semiconductor device. In one embodiment only electrodes 102 and 518 are coupled to electrical sources and electrodes 112 and 508 are allowed to 'float' so that all three semiconductor structures operate in unison. Alternatively, electrodes 112 and 508 may also be coupled to electrical sources and each semiconductor structure may be operated independently. In an exemplary EL semiconductor device, the multiple semiconductor structures may include EL materials that generate different colors of light, e.g. red, blue, and green. Such a design may allow fabrication of a compact, variable color pixel that may be tuned throughout a significant portion of perceivable colors. Such a pixel may be very useful in color display systems. Additionally, this design may allow exemplary EL displays and light sources to emit more light per unit area. The ability to generate, and emit, more light per unit area may be particularly useful in the case of organic EL devices, as low light output has traditionally been an issue for organic EL material.

It is noted that the exemplary EL semiconductor device of FIG. 5 is shown to include three semiconductor structures, however, this number of semiconductor structures is merely illustrative and is not intended to be limiting.

FIG. 4 illustrates an alternative exemplary EL semiconductor device in which lower mobility semiconductor layer 108 has been moved all the way to one side of semiconductor structure 400 so that semiconductor structure 400 includes only one higher mobility semiconductor layer. Otherwise, the exemplary embodiment of FIG. 4 is formed in the same manner as the other exemplary embodiments of the present invention. Electrically, the exemplary semiconductor structure 400 may be similar to the structure of a MOS diode.

It is noted that exemplary semiconductor structure 400 of FIG. 4 may also be formed in a lateral configuration similar to the exemplary embodiment of FIG. 2. Alternatively, the exemplary EL semiconductor device may be formed without substrate 100, thereby obviating the distinction between a 'stacked' or a 'lateral' configuration.

Figure 6:
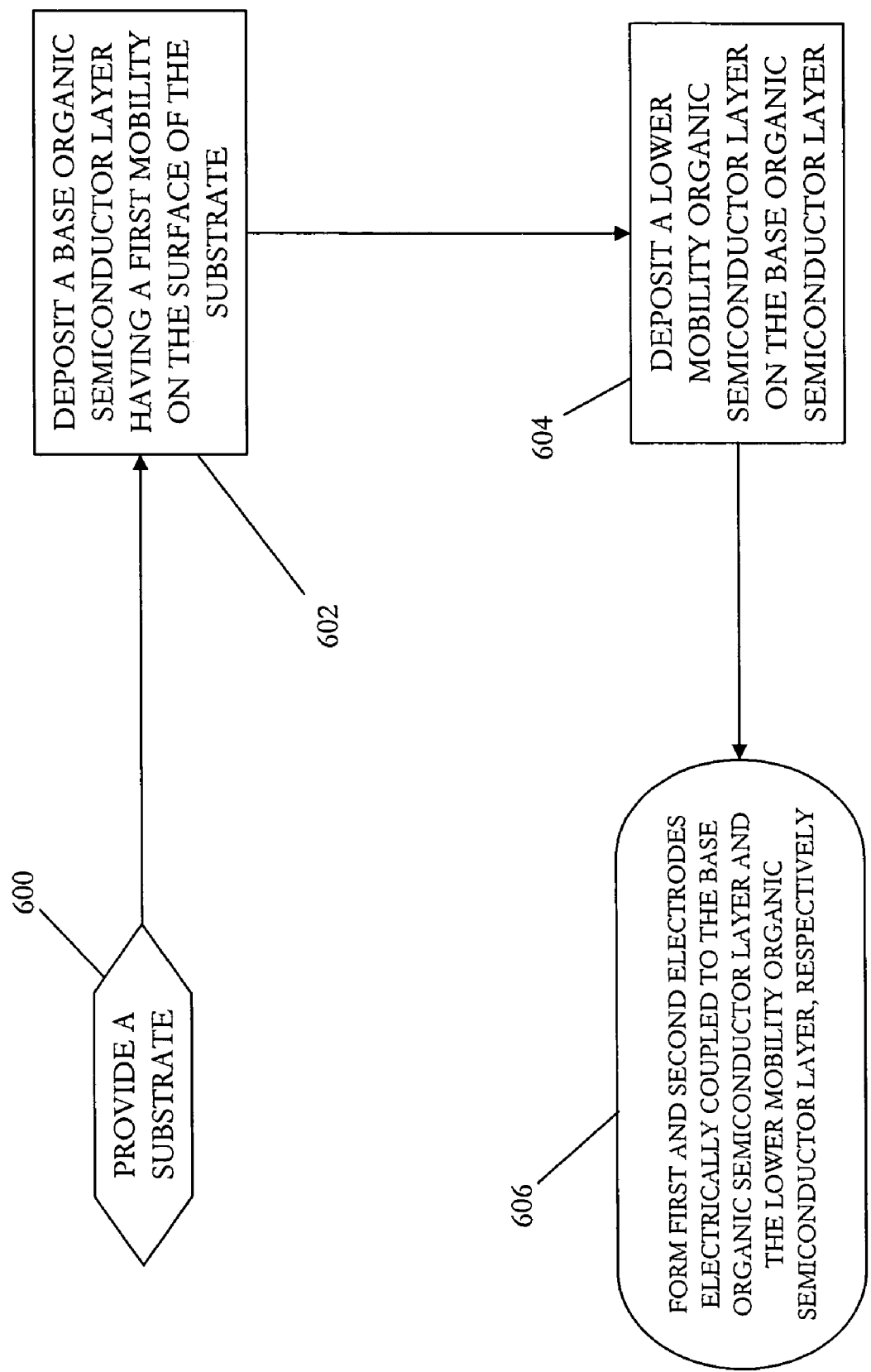
FIG. 6 is a flowchart illustrating an exemplary method of manufacturing an exemplary organic EL semiconductor device with a mobility engineered organic semiconductor structure according to the present invention.
Figure 7:
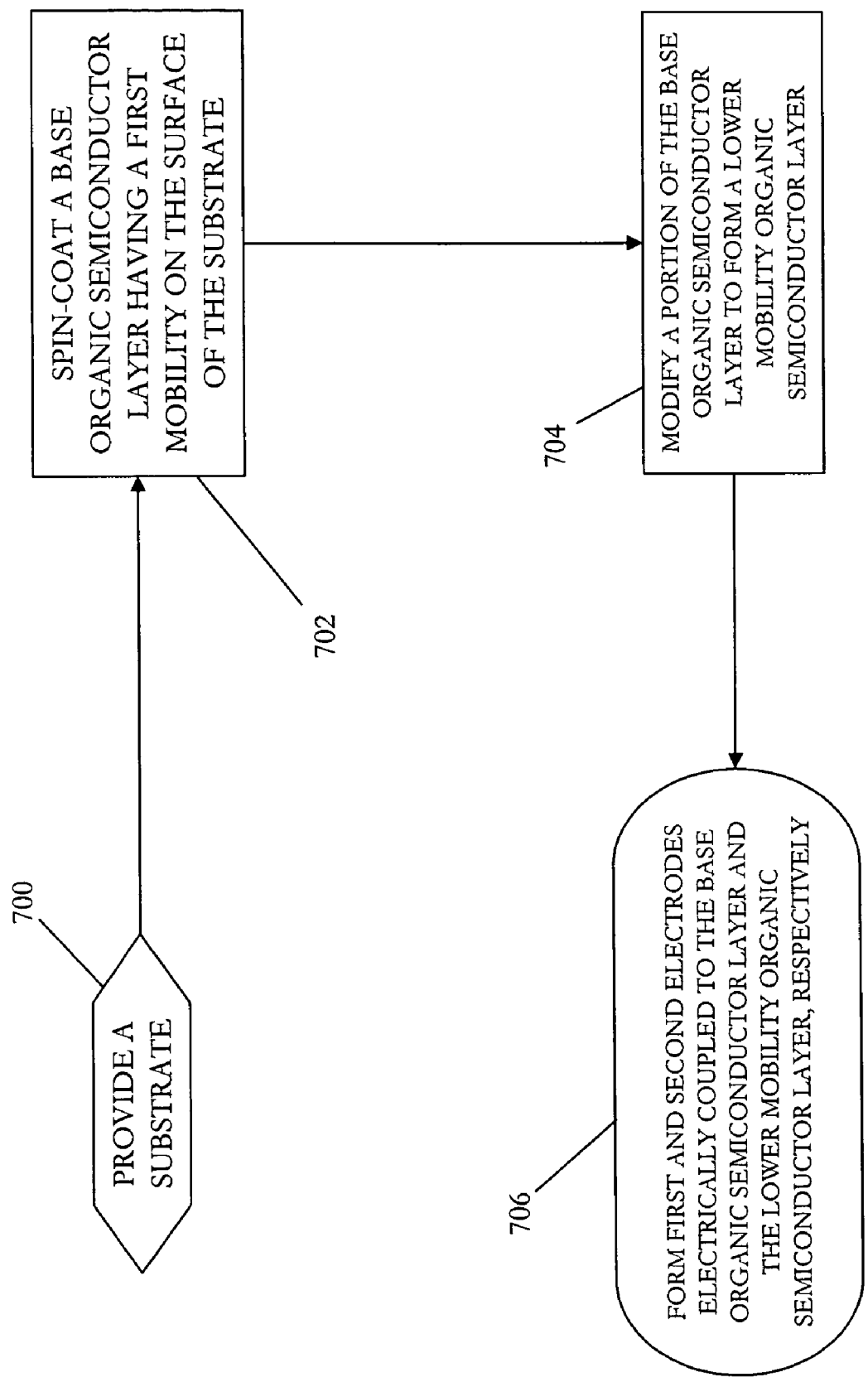
FIG. 7 is a flowchart illustrating another exemplary method of manufacturing an exemplary organic EL semiconductor device with a mobility engineered organic semiconductor structure according to the present invention.
Figure 8:
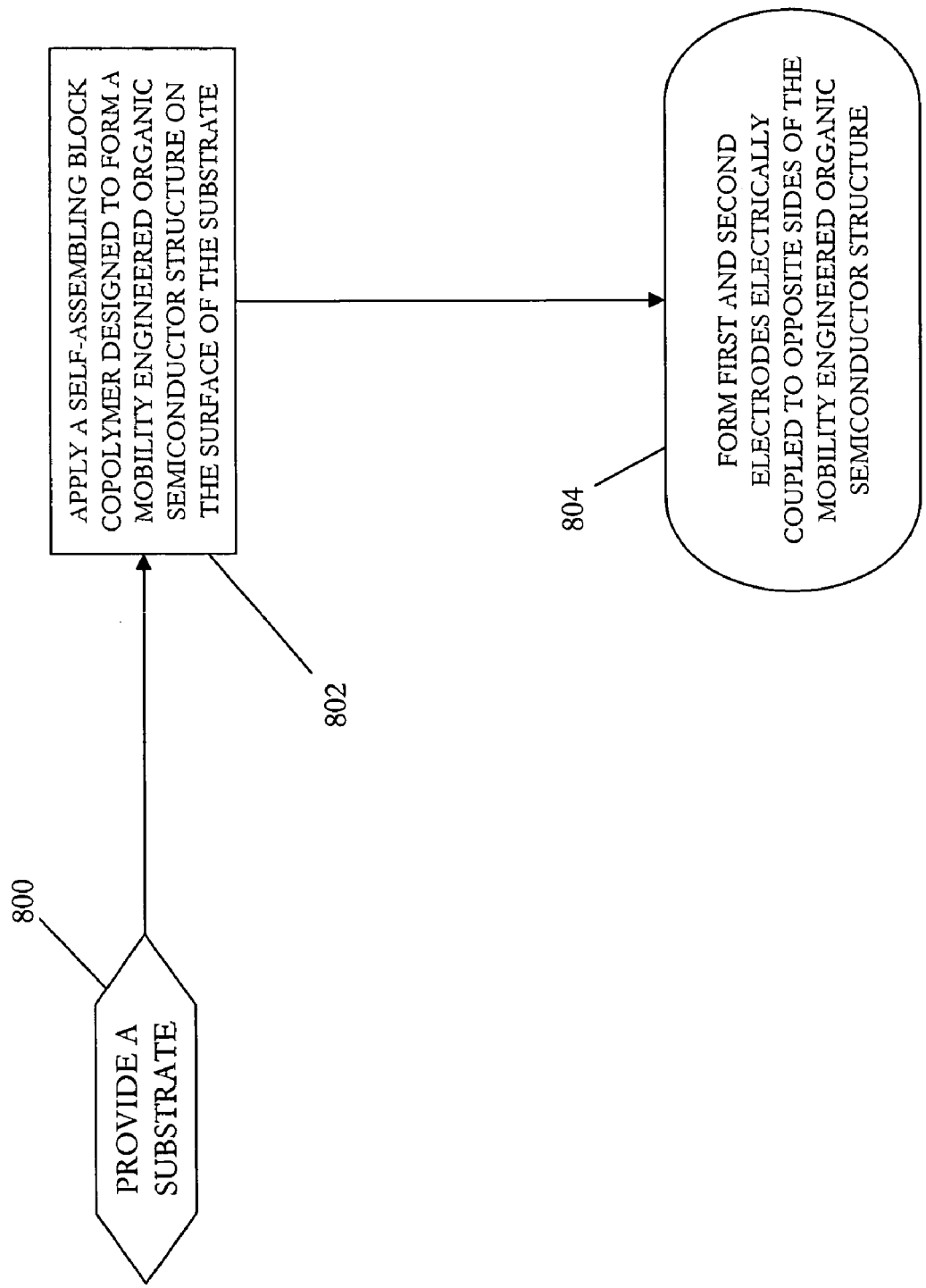
FIG. 8 is a flowchart illustrating a further exemplary method of manufacturing an exemplary organic EL semiconductor device with a mobility engineered organic semiconductor structure according to the present invention.

FIGS. 6, 7, and 8 illustrate exemplary methods of forming an EL organic semiconductor device according to the present invention.

The exemplary method of FIG. 6 involves forming an EL organic semiconductor device using a deposition technique. A substrate is provided, step 600. A base organic semiconductor layer is deposited on the surface of the substrate, step 602. Any standard deposition technique used for organic semiconductors may be used. The substrate is placed in the deposition chamber and a plurality of deposition parameters are set to predetermined values selected to deposit a base organic semiconductor layer having the desired mobility. The base organic semiconductor layer is then deposited on the surface of the substrate. The specific parameters and setting depend upon the deposition technique selected and the specific organic semiconductor to be deposited.

The lower mobility organic semiconductor layer is deposited on the base organic semiconductor layer, step 604. The lower mobility organic semiconductor layer has a mobility that is less than the mobility of the base organic semiconductor layer deposited in step 602. One means of reducing the mobility of the lower mobility organic semiconductor layer is to deposit a different organic semiconducting material that has a lower mobility. Alternatively, at least one of the deposition parameters set in step 602 may be reset to deposit the lower mobility organic semiconductor layer. Examples of resetting the deposition parameters may include: varying the temperature of the substrate; varying a mechanical stress applied to the substrate; varying a mechanical vibration applied to the substrate; varying an external electric field in the deposition chamber; varying an external magnetic field in the deposition chamber; varying the deposition rate of organic semiconductor material; varying the gas pressure (i.e. vacuum) in the deposition chamber; and varying the deposition direction of organic semiconductor material relative to the surface of the substrate. Another means of reducing the mobility of the lower mobility organic semiconductor layer is to dope the organic semiconducting material of the lower mobility organic semiconductor layer. This doping may take place during formation of lower mobility organic semiconductor layer by methods such as coevaporation. Oxygen or water vapor dosage may be used to accomplish this doping.

If the exemplary EL organic semiconductor device being formed is based on the exemplary embodiment of FIG. 4, then the first and second electrodes are formed, step 606. The first electrode is electrically coupled to the base organic semiconductor layer and the second electrode is electrically coupled to the lower mobility organic semiconductor layer.

Otherwise, a top organic semiconductor layer may be deposited on the lower mobility organic semiconductor layer before the electrodes are formed. The top organic semiconductor layer has a mobility greater than the mobility of the lower mobility organic semiconductor layer and desirably similar to the mobility of the base organic semiconductor layer. The second electrode is then coupled to the top organic semiconductor layer and electrically coupled to the lower mobility organic semiconductor layer through the top organic semiconductor layer.

The exemplary method of FIG. 7 involves forming an EL organic semiconductor device using a spin-coat technique. A substrate is provided, step 700. A base organic semiconductor layer is spin-coated on the surface of the substrate, step 702. A portion of the base organic semiconductor layer is modified to form a lower mobility organic semiconductor layer having a mobility that is less than the mobility of the base organic semiconductor layer, step 704. A number of methods may be used to modify this portion of the base organic semiconductor layer including: dosing the portion of the base organic semiconductor layer with a solvent or a gas; irradiating the portion of the base organic semiconductor layer with light or particle radiation; and exposing the portion of the base organic semiconductor layer to plasma.

If the exemplary EL organic semiconductor device being formed is based on the exemplary embodiment of FIG. 4, then the first and second electrodes are formed, step 706. The first electrode is electrically coupled to the base organic semiconductor layer and the second electrode is electrically coupled to the lower mobility organic semiconductor layer.

Otherwise, a top organic semiconductor layer may be spin-coated on the lower mobility organic semiconductor layer before the electrodes are formed. The top organic semiconductor layer has a mobility greater than the mobility of the lower mobility organic semiconductor layer and desirably similar to the mobility of the base organic semiconductor layer. The second electrode is then coupled to the top organic semiconductor layer and electrically coupled to the lower mobility organic semiconductor layer through the top organic semiconductor layer.

The exemplary method of FIG. 8 involves forming an EL organic semiconductor device using a self-assembling block copolymer technique. A substrate is provided, step 800. A self-assembling block copolymer is applied on the surface of the substrate and allowed to self-assemble, step 802. This self-assembling block copolymer is designed to form the desired mobility engineered organic semiconductor structure.

First and second electrodes are formed such that they are electrically coupled to opposite sides of the mobility engineered organic semiconductor structure, step 804, to complete this exemplary method.

Although the invention is illustrated and described herein with reference to specific embodiments, it is not intended to be limited to the details shown. Rather, various modifications may be made in the details within the scope and range of equivalents of the claims and without departing from the invention. In particular, one skilled in the art may understand that many features of the various specifically illustrated embodiments may be mixed to form additional exemplary EL semiconductor devices also embodied by the present invention.

What is claimed:

1. An electroluminescent (EL) device comprising:
a semiconductor structure including:
a first higher mobility semiconductor layer having a first mobility;
a second higher mobility semiconductor layer having a second mobility; and
a lower mobility semiconductor layer formed between the first higher mobility semiconductor layer and the higher mobility second semiconductor layer, the lower mobility semiconductor layer having a third mobility that is less than the first mobility and the second mobility, wherein the ratio of the first mobility to the third mobility and the ratio of the second mobility to the third mobility are each at least 2:1;
where the semiconductor structure includes EL semiconducting material in at least one of the first higher mobility semiconductor layer, the second higher mobility semiconductor layer, or the lower mobility semiconductor layer;
a first electrode coupled to the first higher mobility semiconductor layer of the semiconductor structure;
a second electrode coupled to the second higher mobility semiconductor layer of the semiconductor structure; and
the first and second higher mobility semiconductor layers are formed from polarizable bipolar semiconductor material.

2. An EL device according to claim 1, wherein the semiconductor structure is formed of a self-assembling block copolymer organic semiconductor material.

3. An EL device according to claim 1, wherein the semiconductor structure is formed of at least one of: an inorganic semiconductor material; a small molecule organic semiconductor material; an oligomer organic semiconductor material; or a polymer organic semiconductor material.

4. An EL device according to claim 1, wherein at least one of the first electrode and the second electrode is substantially transmissive to light emitted by the electroluminescent semiconducting material.

5. An EL device according to claim 1, wherein the first higher mobility semiconductor layer and the second higher mobility semiconductor layer of the semiconductor structure include a bipolar organic semiconductor material.

6. An EL device according to claim 1, wherein:
the first higher mobility semiconductor layer of the semiconductor structure includes a p-type semiconductor material; and
the second higher mobility semiconductor layer of the semiconductor structure includes an n-type semiconductor material.

7. An EL device according to claim 1, wherein:
the first higher mobility semiconductor layer of the semiconductor structure includes a bipolar organic semiconductor material; and
the second higher mobility semiconductor layer of the semiconductor structure includes one of a p-type semiconductor material or an n-type semiconductor material.

8. An EL device according to claim 1, wherein:
the first higher mobility semiconductor layer of the semiconductor structure has a first thickness; and
the second higher mobility semiconductor layer of the semiconductor structure has a second thickness that is greater than the first thickness of the first higher mobility semiconductor layer.

9. An EL device according to claim 1, wherein the first mobility of the first higher mobility semiconductor layer of the semiconductor structure is greater than the second mobility of the second higher mobility semiconductor layer of the semiconductor structure.

10. An EL device according to claim 1, further comprising:
a substrate having a surface;
wherein the semiconductor structure is arranged in a stacked configuration on the surface of the substrate such that the first higher mobility semiconductor layer is between the lower mobility semiconductor layer and the surface of the substrate.

11. An EL device according to claim 1, further comprising:
a substrate having a surface;
wherein the semiconductor structure is arranged in a lateral configuration on the surface of the substrate such that the first higher mobility semiconductor layer, the second higher mobility semiconductor layer, and the lower mobility semiconductor layer are formed directly on the surface of the substrate.

12. An EL device according to claim 1, wherein the semiconductor structure further includes one of:
- an electron blocking layer between the first higher mobility semiconductor layer and the lower mobility semiconductor layer;
- an electron blocking layer between the second higher mobility semiconductor layer and the lower mobility semiconductor layer;
- a hole blocking layer between the first higher mobility semiconductor layer and the lower mobility semiconductor layer;
- a hole blocking layer between the second higher mobility semiconductor layer and the lower mobility semiconductor layer; an electron blocking layer between the first higher mobility semiconductor layer and the lower mobility semiconductor layer, and a hole blocking layer between the second higher mobility semiconductor layer and the lower mobility semiconductor layer; or
- an electron blocking layer between the second higher mobility semiconductor layer and the lower mobility semiconductor layer and a hole blocking layer between the first higher mobility semiconductor layer and the lower mobility semiconductor layer.

13. An EL device according to claim 1, further comprising: another semiconductor structure including: a third higher mobility semiconductor layer coupled to the second electrode and having a fourth mobility; a fourth higher mobility semiconductor layer having a fifth mobility; and another lower mobility semiconductor layer formed between the third semiconductor layer and the fourth semiconductor layer, the other lower mobility semiconductor layer having a sixth mobility that is less than the fourth mobility and the fifth mobility; and
- a third electrode coupled to the fourth higher mobility semiconductor layer of the other semiconductor structure.

14. An EL device according to claim 1, further comprising a gate electrode electrically coupled to the semiconductor structure.

* * * * *

UNITED STATES PATENT AND TRADEMARK OFFICE
CERTIFICATE OF CORRECTION

| | | |
|---|---|---|
| PATENT NO. | : 8,026,512 B2 | Page 1 of 1 |
| APPLICATION NO. | : 11/600370 | |
| DATED | : September 27, 2011 | |
| INVENTOR(S) | : Fong et al. | |

It is certified that error appears in the above-identified patent and that said Letters Patent is hereby corrected as shown below:

On the cover page, Item (75), the third inventor's name "George M. Malliaras" is incorrect, it should read --George G. Malliaras--.

Signed and Sealed this
Fourteenth Day of February, 2012

David J. Kappos
*Director of the United States Patent and Trademark Office*